United States Patent
Park et al.

(10) Patent No.: US 12,108,544 B2
(45) Date of Patent: Oct. 1, 2024

(54) MULTI-LAYER PRINTED CIRCUIT BOARD MADE OF DIFFERENT MATERIALS AND MANUFACTURING METHOD THEREOF

(71) Applicant: TSE CO., LTD., Chungcheongnam-do (KR)

(72) Inventors: Eun Ha Park, Chungcheongnam-do (KR); Sang Wook Youn, Chungcheongnam-do (KR); Young Jun Kim, Chungcheongnam-do (KR); Yu Jin Choi, Chungcheongnam-do (KR); Kum Sun Park, Chungcheongnam-do (KR); Chung Hyeon Kim, Chungcheongnam-do (KR)

(73) Assignee: TSE CO., LTD., Cheonan-si (KR)

( * ) Notice: Subject to any disclaimer, the term of this patent is extended or adjusted under 35 U.S.C. 154(b) by 0 days.

(21) Appl. No.: 17/556,310

(22) Filed: Dec. 20, 2021

(65) Prior Publication Data

US 2022/0386478 A1  Dec. 1, 2022

(30) Foreign Application Priority Data

May 28, 2021  (KR) .................. 10-2021-0069277

(51) Int. Cl.
*H05K 3/46*     (2006.01)
*H05K 1/03*     (2006.01)
*H05K 3/00*     (2006.01)

(52) U.S. Cl.
CPC ......... *H05K 3/4644* (2013.01); *H05K 1/0306* (2013.01); *H05K 3/0047* (2013.01); *H05K 3/465* (2013.01); *H05K 2201/0145* (2013.01)

(58) Field of Classification Search
CPC .... H05K 3/4644; H05K 3/0047; H05K 3/465; H05K 3/4623
See application file for complete search history.

(56) References Cited

U.S. PATENT DOCUMENTS 4,299,873 A * 11/1981 Ogihara .................. B32B 9/045
                                                      501/15
4,712,161 A * 12/1987 Pryor .................. H01L 21/4857
                                                      428/209
(Continued)

FOREIGN PATENT DOCUMENTS

JP        2015-159242 A      9/2015
KR    10-2020-0031112 A      3/2020
(Continued)

OTHER PUBLICATIONS

Office Action dated Oct. 19, 2022 (10 pages) from corresponding Korean Application 10-2021-0069277.
(Continued)

*Primary Examiner* — Jeffrey T Carley
*Assistant Examiner* — Jose K Abraham
(74) *Attorney, Agent, or Firm* — Crowell & Moring LLP; John C. Freeman

(57) ABSTRACT

A circuit board including an adhesive part, a ceramic board part with the adhesive part, and a printed circuit board part with the adhesive part. The ceramic board and printed circuit board parts are made of different materials. The adhesive part includes: an adhesive layer including an adhesive material, an adhesive part opening, and a conductive paste filled in an inside of the adhesive part opening.

A method including providing a ceramic board part, providing a printed circuit board part, and producing an adhesive part. Batch-bonding the printed circuit board part, the adhesive part, and the ceramic board part with one another. Producing the adhesive part includes: bonding a protection layer on two surfaces of an adhesive layer, forming an adhesive part opening penetrating the adhesive layer and the protection layer, filling the adhesive part opening with a conductive paste, and removing the protection layer.

7 Claims, 9 Drawing Sheets

(56) References Cited

U.S. PATENT DOCUMENTS

| | | | | | |
|---|---|---|---|---|---|
| 4,715,117 | A * | 12/1987 | Enomoto | H05K 3/0055 | 174/266 |
| 4,740,414 | A * | 4/1988 | Shaheen | H05K 1/113 | 428/428 |
| 5,590,460 | A * | 1/1997 | DiStefano | H01R 12/714 | 174/265 |
| 5,686,702 | A * | 11/1997 | Ishida | H01L 23/5383 | 174/250 |
| 5,688,584 | A * | 11/1997 | Casson | H05K 3/462 | 428/209 |
| 6,465,084 | B1 * | 10/2002 | Curcio | H05K 3/462 | 428/209 |
| 6,488,795 | B1 * | 12/2002 | Sakai | H05K 3/4611 | 156/89.18 |
| 6,534,723 | B1 * | 3/2003 | Asai | H01L 23/49811 | 174/262 |
| 6,638,607 | B1 * | 10/2003 | Curcio | H01L 21/4857 | 428/209 |
| 6,645,607 | B2 * | 11/2003 | Curcio | H05K 3/462 | 428/209 |
| 7,243,424 | B2 * | 7/2007 | Hatanaka | H05K 1/162 | 29/850 |
| 7,279,412 | B2 * | 10/2007 | Mok | H05K 3/462 | 29/829 |
| 7,402,254 | B2 * | 7/2008 | Curcio | H05K 3/462 | 29/829 |
| 7,849,591 | B2 * | 12/2010 | Okamoto | H05K 1/186 | 29/830 |
| RE45,637 | E * | 7/2015 | Vasoya | H05K 3/4641 | |
| 2001/0023779 | A1 * | 9/2001 | Sugaya | H05K 1/16 | 174/255 |
| 2002/0038725 | A1 * | 4/2002 | Suzuki | H05K 3/4069 | 174/262 |
| 2002/0045394 | A1 * | 4/2002 | Noda | B32B 27/04 | 442/180 |
| 2003/0007330 | A1 * | 1/2003 | Kondo | H05K 3/4632 | 361/748 |
| 2004/0194303 | A1 * | 10/2004 | Kim | H05K 3/462 | 29/831 |
| 2005/0085065 | A1 * | 4/2005 | Mok | H05K 3/462 | 438/622 |
| 2005/0280136 | A1 * | 12/2005 | Curcio | B32B 3/266 | 257/686 |
| 2006/0121255 | A1 * | 6/2006 | Nam | C25D 5/022 | 428/209 |
| 2007/0246254 | A1 * | 10/2007 | Kumar | H05K 3/4623 | 174/264 |
| 2009/0154132 | A1 * | 6/2009 | Okamoto | H01L 23/5389 | 156/228 |
| 2011/0024167 | A1 * | 2/2011 | Hashimoto | H05K 3/4688 | 29/846 |
| 2011/0289774 | A1 * | 12/2011 | Kumar | H05K 3/4617 | 29/852 |
| 2012/0003844 | A1 * | 1/2012 | Kumar | H05K 3/4623 | 29/841 |
| 2014/0231126 | A1 * | 8/2014 | Hunrath | H05K 3/4069 | 174/264 |
| 2014/0353018 | A1 * | 12/2014 | Soeda | H05K 3/4614 | 174/257 |
| 2016/0027709 | A1 * | 1/2016 | Okamoto | H01L 23/49838 | 257/693 |
| 2017/0034917 | A1 * | 2/2017 | Hongo | H01L 23/49883 | |
| 2017/0156209 | A1 * | 6/2017 | Wang | H05K 1/116 | |
| 2017/0244015 | A1 | 8/2017 | Nakabayashi et al. | | |
| 2019/0320530 | A1 * | 10/2019 | Bahl | H05K 3/4623 | |
| 2021/0159158 | A1 * | 5/2021 | Chen | H01L 23/49866 | |
| 2022/0108943 | A1 | 4/2022 | Hashimoto et al. | | |
| 2022/0256717 | A1 * | 8/2022 | Lau | H05K 3/4069 | |
| 2022/0281035 | A1 | 9/2022 | Nishimura et al. | | |

FOREIGN PATENT DOCUMENTS

| | | |
|---|---|---|
| TW | 2021 12482 A | 4/2021 |
| TW | 2021 19891 A | 5/2021 |

OTHER PUBLICATIONS

Office Action dated Sep. 16, 2022 (10 pages) out of corresponding Taiwanese Application No. 110147352.

\* cited by examiner

MULTI-LAYER PRINTED CIRCUIT BOARD MADE OF DIFFERENT MATERIALS AND MANUFACTURING METHOD THEREOF

CROSS-REFERENCE TO RELATED APPLICATION

This application is based on and claims priority under 35 U.S.C. § 119 to Korean Patent Application No. 10-2021-0069277 filed on May 28, 2021, in the Korean Intellectual Property Office, the entire disclosure of which is herein incorporated by reference in its entirety.

BACKGROUND

Field

Various embodiments of the disclosure relate to a multi-layer printed circuit board and a method for manufacturing the multi-layer printed circuit board.

Description of Related Art

With the miniaturization of a semiconductor process and the high integration of a device, it is demanded to increase the number of probe pins, to reduce the size of a pad, and to achieve a fine pitch, and there is a need for development of a multi-layer circuit board. Due to the increase of complexity and density of a semiconductor device circuit, the limits in technology and design are challenged, and in order to expand text channels, an increase of circuit layers cannot be avoided.

The increase of circuit layers causes not only the increase of a turn-around time (TAT) and product manufacturing difficulty but also evenness problems due to the circuit layer increase.

According to the method for manufacturing a multi-layer printed circuit board in the related art, a multi-layer printed circuit board is manufactured by sequentially forming liquid polyimide or polyimide sheets on a ceramic board. According to the manufacturing method in the related art, respective layers of the multi-layer printed circuit board may be manufactured by repeating the same process. After a first layer of the multi-layer printed circuit board is manufactured, a second layer may be formed on an upper part of the first layer through repetition of the same process as the first layer manufacturing process. Through such repetitions, third, fourth, and more additional printed circuit board layers may be manufactured. Specifically, in the process of manufacturing the respective layers, liquid polyimide coating, thermal bonding, drilling, sputtering, circuit pattern plating using dry film photoresist, and etching processes may be performed on one surface of the ceramic board.

It is difficult for the respective layers of the multi-layer printed circuit board manufactured by the manufacturing method in the related art to be evenly implemented. According to the manufacturing method in the related art, in the process of manufacturing the respective layers of the multi-layer printed circuit board, respective thermal bonding processes are performed. However, since there is a difference in coefficient of thermal expansion (CTE) between respective materials, there occurs a difference between the degrees of expansion of the materials when the materials are heated, and, thus, bending of the materials occurs due to the thermal stress. Due to deformation of members caused by such bending, it is difficult to evenly implement the respective layers.

Further, in case of manufacturing the multi-layer printed circuit board in the manufacturing method in the related art, the production period is relatively lengthened. In case of manufacturing the printed circuit board through stacking up layer-by-layer the liquid polyimide on the ceramic board as in the manufacturing method in the related art, since the manufacturing process is repeated as many as the number of layers as the total number of layers is increased, the production period of the printed circuit board is lengthened.

SUMMARY

An aspect of the disclosure is to provide a multi-layer printed circuit board and a manufacturing method thereof, which can provide the multi-layer printed circuit board in which respective layers are evenly implemented and can reduce the production period of the multi-layer printed circuit board by minimizing thermal bonding processes.

A multi-layer printed circuit board made of different materials according to an embodiment of the disclosure may include: an adhesive part; a ceramic board part combined with one surface of the adhesive part; and a printed circuit board part combined with the other surface of the adhesive part and including a different material from a material of the ceramic board part, wherein the adhesive part includes: an adhesive layer including an adhesive material; an adhesive part opening formed to penetrate the adhesive layer; and a conductive paste filled in an inside of the adhesive part opening.

A method for manufacturing a multi-layer printed circuit board made of different materials according to an embodiment of the disclosure may include: providing a ceramic board part; providing a printed circuit board part; producing an adhesive part capable of connecting the ceramic board part and the printed circuit board part to each other; and batch-bonding the printed circuit board part, the adhesive part, and the ceramic board part with one another, wherein producing the adhesive part includes: bonding a protection layer on one surface and the other surface of an adhesive layer; forming an adhesive part opening penetrating the adhesive layer and the protection layer; filling the adhesive part opening with a conductive paste; and removing the protection layer.

According to the method for manufacturing the multi-layer printed circuit board made of the different materials according to an embodiment of the disclosure, the boards of the different materials are connected to each other through production of the separate adhesive part, and, thus, the production period of the multi-layer printed circuit board can be shortened. Further, according to the method for manufacturing the multi-layer printed circuit board made of the different materials according to an embodiment of the disclosure, since the ceramic board part, the adhesive part, and the printed circuit board part are simultaneously produced, and then are batch-bonded in the final stage, it is possible to perform the thermal process, which has been performed by layers in the related art, only once in the final stage. Through the minimization of the thermal processes, the problem caused by the bending can be alleviated, and thus the multi-layer printed circuit board can be evenly implemented.

BRIEF DESCRIPTION OF THE DRAWINGS

The above and other aspects, features and advantages of certain embodiments of the disclosure will be more apparent from the following detailed description, taken in conjunction with the accompanying drawings, in which.

DETAILED DESCRIPTION

Figure 1:
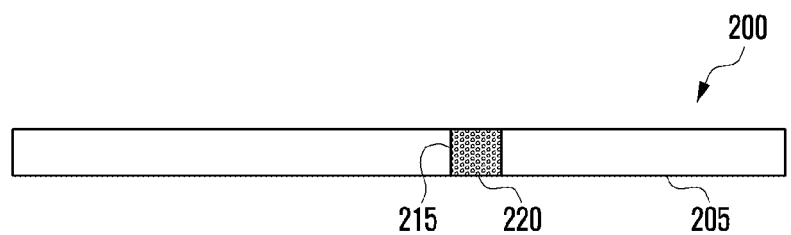
FIG. 1 is a cross-sectional view illustrating an adhesive part according to an embodiment of the disclosure.

FIG. 1 is a cross-sectional view illustrating an adhesive part 200 according to an embodiment of the disclosure.

An adhesive part 200 may include an adhesive layer 205, an adhesive part opening 215, and/or a conductive paste 220.

The adhesive layer 205 may include an adhesive material. For example, components of the adhesive layer 205 may include a pre-impregnated material (prepreg). The prepreg means a material made by impregnating specially mixed epoxy resin with reinforcing fiber. The prepreg may have excellent heat resistance and strength, and may have high chemical stability. Further, the dimensional stability may be obtained through usage of the low-flow prepreg of the resin.

The adhesive layer 205 may bond the ceramic board part 300 (refer to FIG. 2) on one surface of the adhesive layer 205. The adhesive layer 205 may bond the printed circuit board part 400 (refer to FIG. 3) on the other surface of the adhesive layer 205.

For convenience, only one adhesive part opening 215 is illustrated in FIG. 1, but the number of adhesive part openings 215 is not limited thereto. The adhesive layer 205 may include a plurality of adhesive part openings 215.

The adhesive part opening 215 may include a space in which the conductive paste 220 may fill. The conductive paste 220 may fill in the adhesive part opening 215. The conductive paste 220 may include a conductive material. For example, the conductive paste 220 may include a copper-tin alloy material.

Figure 2:
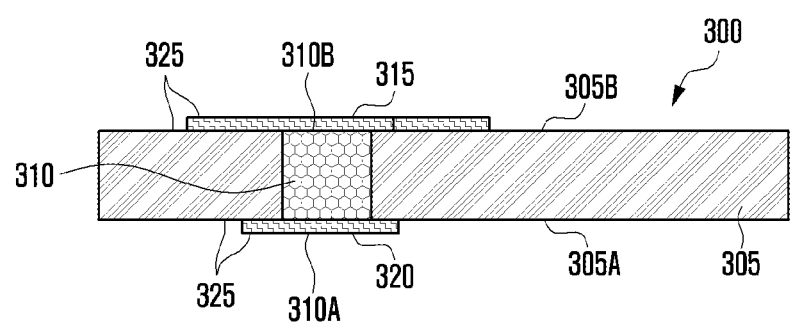
FIG. 2 is a cross-sectional view illustrating a ceramic board part according to an embodiment of the disclosure.

FIG. 2 is a cross-sectional view illustrating a ceramic board part 300 according to an embodiment of the disclosure.

A ceramic board part 300 according to an embodiment of the disclosure may include a ceramic board 305, a ceramic through-hole 310, an upper conductive layer 315, and/or a lower conductive layer 320.

The ceramic board 305 may play a role of a board that becomes the basis of the structure of the ceramic board part 300. The ceramic board 305 may include a ceramic material. The ceramic material may have excellent electrical insulation and mechanical strength, and may have high heat resistance and chemical stability.

The ceramic board 305 has a similar coefficient of thermal expansion (CTE) to the CTE of a silicon wafer used in semiconductors, and, thus, may be used for semiconductor inspection.

The ceramic board 305 may include the ceramic through-hole 310. A plurality of ceramic through-holes 310 may be formed in the ceramic board 305. The ceramic through-hole 310 may play a role of a passage for electrically connecting the upper conductive layer 315 and the lower conductive layer 320 to each other. The ceramic through-hole 310 may be formed through a mechanical drilling process.

In various embodiments, the upper conductive layer 315 and the lower conductive layer 320 may be located on at least parts of the ceramic board 305. A first surface 305A of the ceramic board 305 may be a lower surface of the ceramic board 305, and a second surface 305B of the ceramic board 305 may be an upper surface of the ceramic board 305. The lower conductive layer 320 of the ceramic board 305 may be located on the first surface 305A of the ceramic board 305 (e.g., lower surface of the ceramic board 305). The upper conductive layer 315 of the ceramic board 305 may be located on the second surface 305B of the ceramic board 305 (e.g., upper surface of the ceramic board 305).

The upper conductive layer 315 and the lower conductive layer 320 may include conductive materials. The upper conductive layer 315 and the lower conductive layer 320 may be made of any one metal of copper, gold, and nickel and an alloy thereof, and it may be preferable that they are made of copper in comprehensive consideration of electrical conductivity, durability, and economics.

The upper conductive layer 315 and the lower conductive layer 320 may include circuit patterns 325. The circuit patterns 325 may be formed through photolithography, plating, and etching processes.

A first opening 310A of the ceramic through-hole 310 may be a lower opening of the ceramic through-hole 310, and a second opening 310B may be an upper opening of the ceramic through-hole 310. The lower conductive layer 320 may be formed on the first opening 310A of the ceramic through-hole 310 (e.g., lower opening of the ceramic through-hole 310). The upper conductive layer 315 may be formed on the second opening 310B of the ceramic through-hole 310 (e.g., upper opening of the ceramic through-hole 310).

Figure 3:
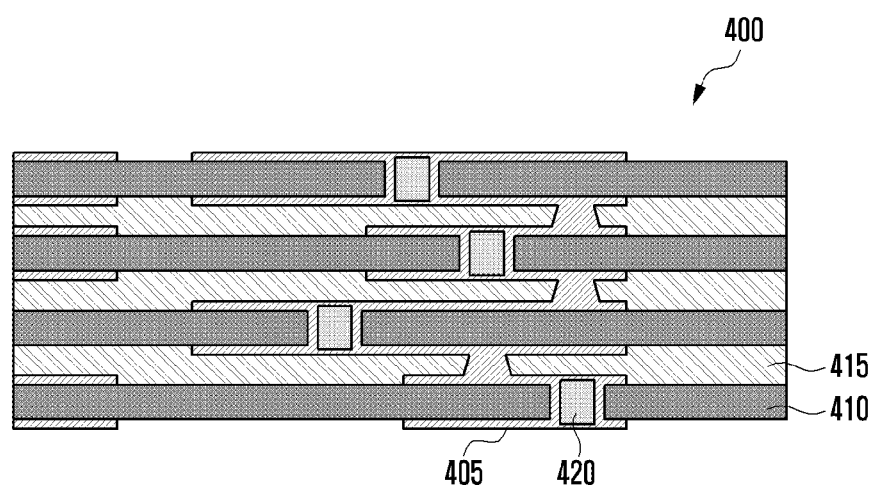
FIG. 3 is a cross-sectional view illustrating a printed circuit board part according to an embodiment of the disclosure.

FIG. 3 is a cross-sectional view illustrating a printed circuit board part 400 according to an embodiment of the disclosure.

A printed circuit board part 400 may include a conductive layer 405, a core layer 410, and intermediate layer 415, and/or a through-hole 420.

The conductive layer 405 may be formed on one surface and the other surface of the core layer 410. The conductive layer 405 may include a conductive material. The conductive layer 405 may be made of any one metal of copper, gold, and nickel and an alloy thereof, and it may be preferable that the conductive layer 405 is made of copper in comprehensive consideration of electrical conductivity, durability, and economics.

The core layer 410 may play a role of a board that becomes the basis of the structure of the printed circuit board part 400. The core layer 410 may include a different material from the material of the ceramic board part 30) (refer to FIG. 2). The core layer 410 may include an insulating material. For example, the component of the core layer 410 may include polyimide. The conductive layer 405 may be formed on one surface of one core layer 410 and the other surface of another core layer 410.

The intermediate layer 415 may be formed between the core layers 410. The intermediate layer 415 may include an insulating and adhesive material, and may play a role of an adhesive for connecting the respective core layers 410.

The through-hole 420 may be formed between the conductive layers 405 formed on one surface and the other surface of the core layer 410. The through-hole 420 may play a role of a passage for electrically connecting the respective conductive layers 405 to each other.

Figure 4:
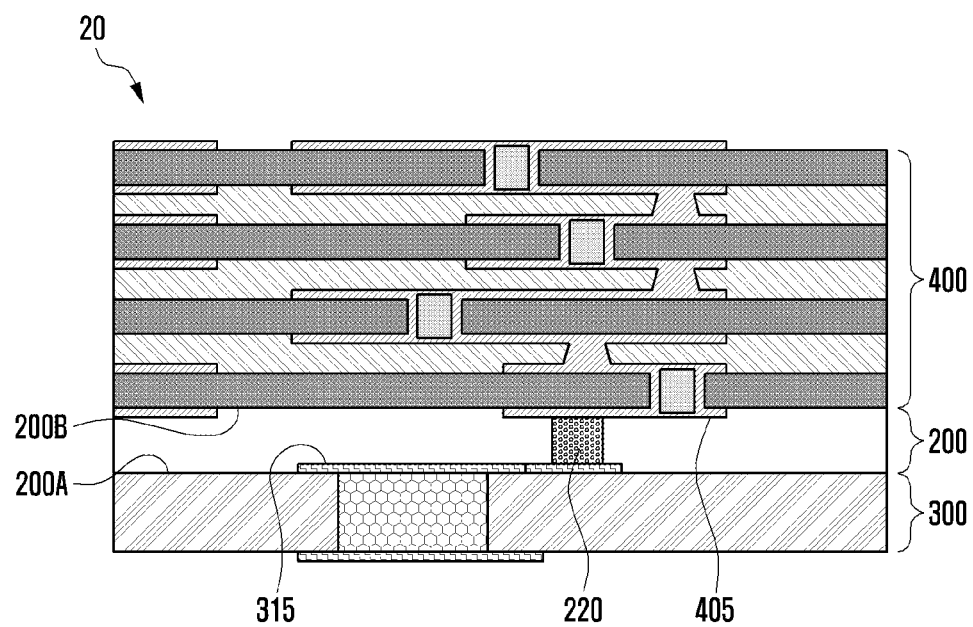
FIG. 4 is a cross-sectional view illustrating a multi-layer printed circuit board using the adhesive part, the ceramic board part, and the printed circuit board part of FIGS. 1-3 according to an embodiment of the disclosure.

FIG. 4 is a cross-sectional view illustrating a multi-layer printed circuit board 20 according to an embodiment of the disclosure.

The multi-layer printed circuit board 20 according to an embodiment of the disclosure may include the adhesive part 200, the ceramic board part 300, and/or the printed circuit board part 400 as previously described with respect to FIGS. 1-3.

In various embodiments, the ceramic board part 30) or the printed circuit board part 400 may be combined with at least a part of the adhesive part 200. A first surface 200A of the adhesive part 200 may be a lower surface of the adhesive part 200, and a second surface 200B of the adhesive part 200 may be an upper surface of the adhesive part 200. The ceramic board part 300 may be adhered and combined with the first surface 200A of the adhesive part 200 (e.g., lower surface of the adhesive part 200). The printed circuit board part 400 may be adhered and combined with the second surface 200B of the adhesive part 200 (e.g., upper surface of the adhesive part 200).

The conductive paste 220 may play a role of electrical connection between the upper conductive layer 315 of the ceramic board part 300 located on the first surface 200A of the adhesive part 200 and the conductive layer 405 of the printed circuit board part 400 located on the second surface 200B of the adhesive part 200.

Figure 5:
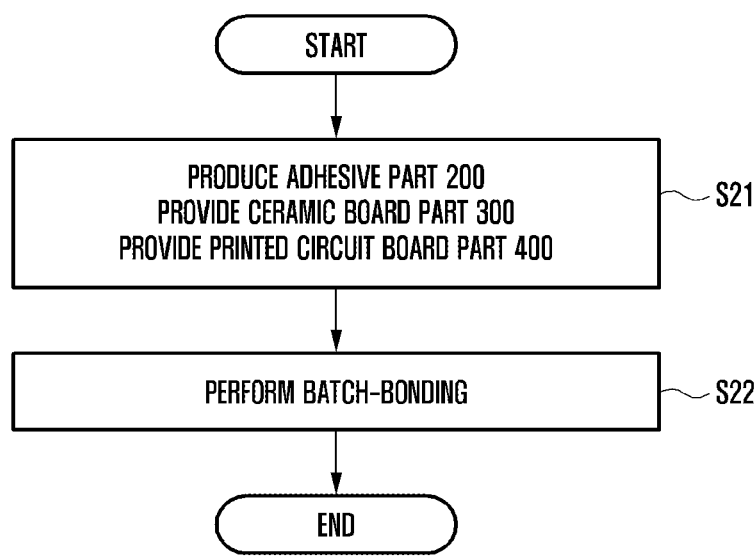
FIG. 5 is a flowchart illustrating a method for manufacturing the multi-layer printed circuit board of FIG. 4 according to an embodiment of the disclosure.

FIG. 5 is a flowchart illustrating a method for manufacturing a multi-layer printed circuit board 20 (refer to FIG. 4) according to an embodiment of the disclosure.

With reference to FIG. 5, a method for manufacturing a multi-layer printed circuit board 20 (refer to FIG. 4) according to an embodiment of the disclosure includes: producing an adhesive part 200 (refer to FIG. 1), providing a ceramic board part 300 (refer to FIG. 2), and providing a printed circuit board part 400 (refer to FIG. 3) (S21); and batch-bonding the adhesive part 200 (refer to FIG. 1), the ceramic board part 300 (refer to FIG. 2), and the printed circuit board part 400 (refer to FIG. 3) (S22).

Figure 6A:
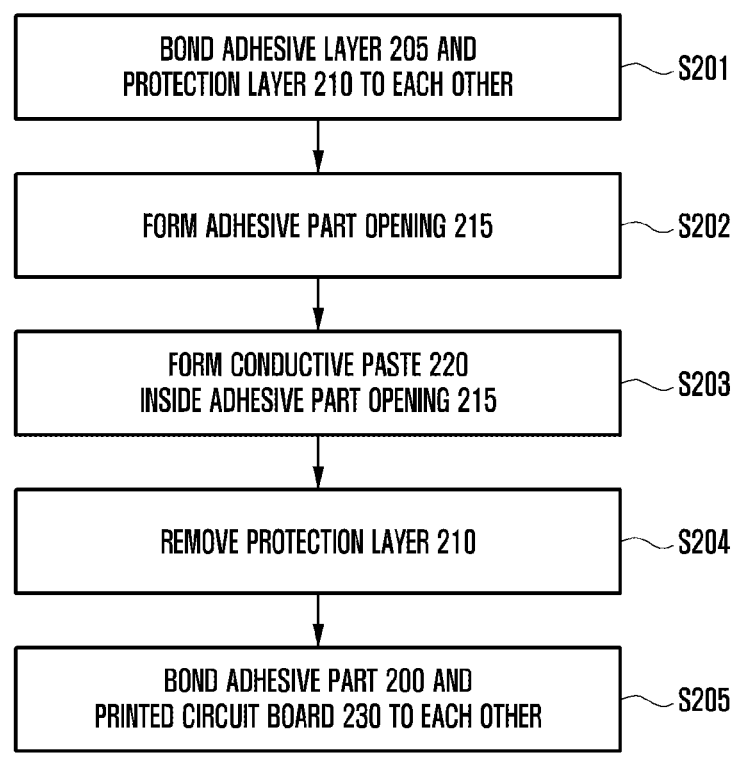
FIGS. 6A and 6B are explanatory diagrams explaining a production process and a function of an adhesive part according to an embodiment of the disclosure.
Figure 6B:
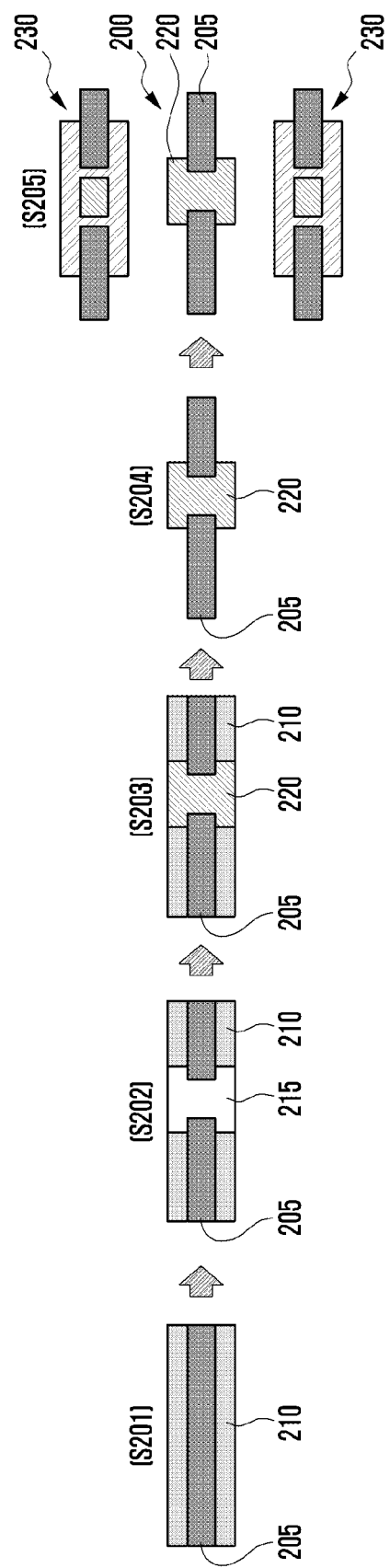

At operation S21, the adhesive part 200 (refer to FIG. 1) including the adhesive layer 205 (refer to FIG. 1) may be produced (refer to FIGS. 6A and 6B). The adhesive part 200 (refer to FIG. 1) may adhere and combine the ceramic board part 300 (refer to FIG. 2) and the printed circuit board part 400 (refer to FIG. 3) with each other.

At operation S21, the ceramic board part 300 (refer to FIG. 2) may be provided. The ceramic board part 300 (refer to FIG. 2) may include a ceramic board 305 (refer to FIG. 2), a ceramic through-hole 310 (refer to FIG. 2), an upper conductive layer 315 (refer to FIG. 2), and/or a lower conductive layer 320 (refer to FIG. 2).

At operation S21, the printed circuit board part 400 (refer to FIG. 3) may be provided. The printed circuit board part 400 (refer to FIG. 3) may include a conductive layer 405 (refer to FIG. 3), a core layer 410 (refer to FIG. 3), an intermediate layer 415 (refer to FIG. 3), and/or a through-hole 420 (refer to FIG. 3).

At operation S22, the adhesive part 200 (refer to FIG. 1), the ceramic board part 300 (refer to FIG. 2), and the printed circuit board part 400 (refer to FIG. 3) may be batch-bonded. For the bonding, the adhesive part 200 (refer to FIG. 7), the ceramic board part 300 (refer to FIG. 7), and the printed circuit board part 400 (refer to FIG. 7) may be disposed (refer to FIG. 7). The disposed adhesive part 200 (refer to FIG. 8), ceramic board part 300 (refer to FIG. 8), and the printed circuit board part 400 (refer to FIG. 8) may be batch-bonded by being thermo-compressed using a press device (not illustrated) (refer to FIG. 8).

FIGS. 6A and 6B are explanatory diagrams explaining a production process and a function of an adhesive part 200 according to an embodiment of the disclosure. FIG. 6A is a flowchart illustrating a production process and a function of the adhesive part 200 according to an embodiment of the disclosure. FIG. 6B is an explanatory diagram representing a process of producing the adhesive part 200 according to the order illustrated in FIG. 6A and the function of the adhesive part 200.

With reference to FIGS. 6A and 6B, a process of producing an adhesive part 200 according to an embodiment of the disclosure includes: bonding an adhesive layer 205 and a protection layer 210 to each other (S201); forming an adhesive part opening 215 penetrating the adhesive layer 205 and the protection layer 210 (S202); filling the adhesive part opening 215 with a conductive paste 220 (S203); and removing the protection layer 210 (S204). The completed adhesive part 200 may perform a function of bonding a printed circuit board 230 on one surface and the other surface of the adhesive part 200 (S205).

At operation S201, the protection layer 210 may be bonded to the one surface and the other surface of the adhesive layer 205. The protection layer 210 may prevent the adhesive layer 205 from being damaged or may prevent foreign substances from flowing onto the adhesive layer 205 at operations (S202 and S203) of forming the adhesive part opening 215 and the conductive paste 220.

The components of the protection layer 210 may include polyethylene terephthalate (PET). The PET is a thermoplastic film, which is easy to be molded, and may prevent an inflow of the foreign substances to be effective in protecting the adhesive layer 205.

At operation S202, the adhesive part opening 215 penetrating the adhesive layer 205 and the protection layer 210 may be formed.

The adhesive part opening 215 may include a space that can be filled with the conductive paste 220.

The adhesive part opening 215 may be included in at least a part of the adhesive layer 205 and the protection layer 210. The adhesive part opening 215 may be formed through mechanical drilling.

For convenience, only one adhesive part opening 215 is illustrated in FIG. 6B, but the number of adhesive part openings 215 is not limited thereto. The adhesive layer 205 and the protection layer 210 may include a plurality of adhesive part openings 215.

The process of producing the adhesive part 200 according to an embodiment of the disclosure may include a process of cleaning an inside of the adhesive part opening 215 after forming the adhesive part opening 215. In order to clean the inside of the adhesive part opening 215, a cleaning process using plasma may be used. The cleaning process may facilitate filling of the conductive paste 220 inside the adhesive part opening 215 at operation S203 by removing dust generated in the process of forming the adhesive part opening 215.

At operation S203, the conductive paste 220 may fill inside the adhesive part opening 215. In order to fill the inside of the adhesive part opening 215 with the conductive paste 220, a method for pushing a material into a hole using a separate member may be used. A member capable of applying pressure to a material, such as a squeezer (not illustrated), may be used to push the conductive paste 220 into the adhesive part opening 215.

At operation S204, the protection layer 210 formed on one surface and the other surface of the adhesive layer 205 may be removed. Although the protection layer 210 plays a role of preventing the damage of the adhesive layer 205 at operations S202 and S203, it may not perform other functions when the printed circuit board 230 is bonded to the adhesive layer 205, and thus may be removed at operation S204.

In case that the production process including operations S201, S202, S203, and S204 has been performed in all, the adhesive part 200 (refer to FIG. 1) can be produced.

Operation S205 of FIG. 6B illustrates the role of the adhesive part 200 having been completed through the operations S201, S202, S203, and S204. At operation S205, the printed circuit board 230 may be adhered and combined with one surface and the other surface of the adhesive part 200. The printed circuit board 230 illustrated in FIG. 6B may mean a board on which a circuit pattern is formed like the ceramic board part 300 (refer to FIG. 2) or the printed circuit board part 400 (refer to FIG. 3).

Figure 7:
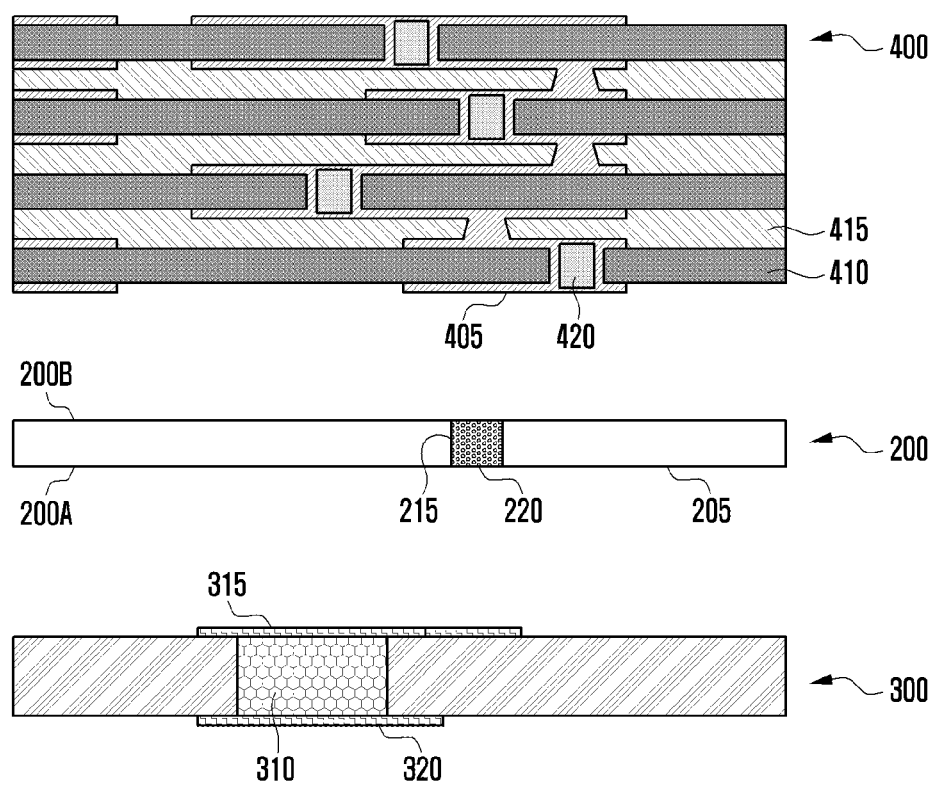
FIG. 7 is a cross-sectional view illustrating an adhesive part, a ceramic board part, and a printed circuit board part according to an embodiment of the disclosure.

FIG. 7 is a cross-sectional view illustrating an adhesive part 200, a ceramic board part 300, and a printed circuit board part 400 according to an embodiment of the disclosure.

In various embodiments, the adhesive part 200, the ceramic board part 300, and the printed circuit board part 400 may be disposed to be spaced apart from one another. The ceramic board part 300 may be located to be spaced apart on the first surface 200A of the adhesive part 200 (e.g., lower surface of the adhesive part 200). The printed circuit board part 400 may be located to be spaced apart on the second surface 200B of the adhesive part 200 (e.g., upper surface of the adhesive part 200).

In FIG. 7, it is illustrated that the adhesive part 200 includes one adhesive part opening 215 and one conductive paste 220, but the number of adhesive part openings 215 and conductive pastes 220 included in the adhesive part 200 is not limited thereto.

The conductive paste 220 may be formed in a location in which it can meet all or parts of the upper conductive layer 315 included in the ceramic board part 300 and the conductive layer 405 included in the printed circuit board part 400. For example, the conductive paste 220 may be formed in the location in which it can meet the upper conductive layer 315 of the ceramic board part 300 located to be spaced apart on the first surface 200A (lower surface) of the adhesive part 200. Further, the conductive paste 220 may be formed in the location in which it can meet the conductive layer 405 of the printed circuit board part 400 located to be spaced apart on the second surface 200B (upper surface) of the adhesive part 200.

The locations of the adhesive part 200, the ceramic board part 300, and the printed circuit board part 400 may be temporarily fixed using the support part (not illustrated). On one side and the other side of the adhesive part 200, the ceramic board part 300, and the printed circuit board part 400, holes (not illustrated) for temporarily combining the support member (not illustrated) may be formed. The support member (not illustrated) may be temporarily combined with the holes (not illustrated), and may align the adhesive part 200, the ceramic board part 300, and the printed circuit board part 400 to be spaced apart from one another.

Figure 8:
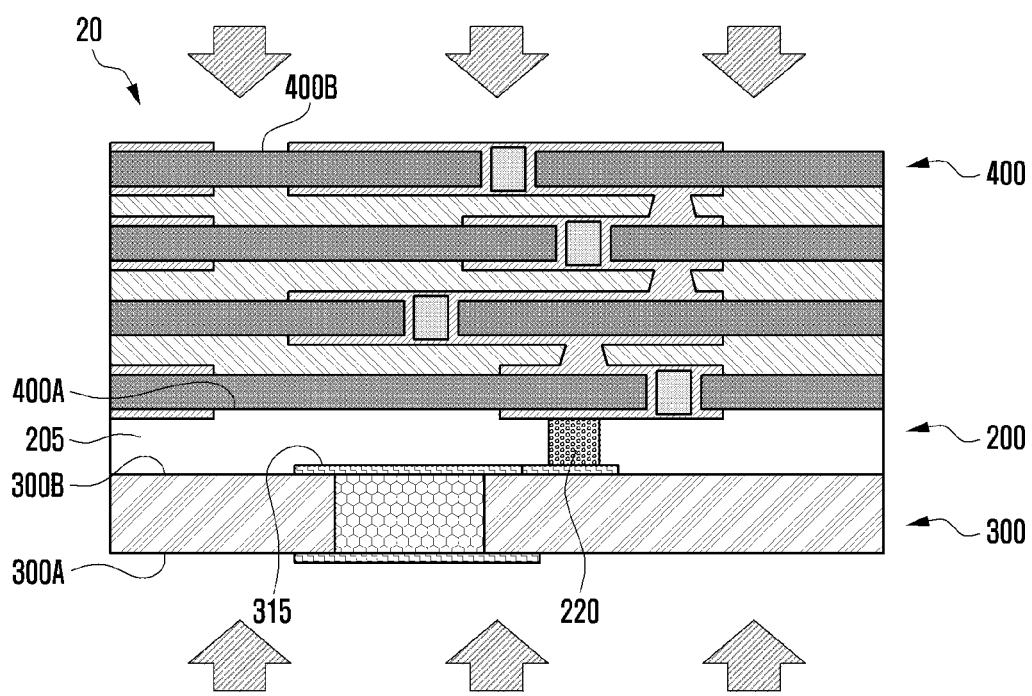
FIG. 8 is an explanatory diagram explaining a state where an adhesive part, a ceramic board part, and a printed circuit board part are thermo-compressed according to an embodiment of the disclosure.

FIG. 8 is an explanatory diagram explaining a state where an adhesive part 200, a ceramic board part 300, and a printed circuit board part 400 are thermo-compressed according to an embodiment of the disclosure.

A first surface 300A of the ceramic board part 300 may be a lower surface of the ceramic board part 300, and a second surface 300B thereof may be an upper surface of the ceramic board part 300. A first surface 400A of the printed circuit board part 400 may be a lower surface of the printed circuit board part 400, and a second surface 400B thereof may be an upper surface of the printed circuit board part 400.

On the second surface 400B of the printed circuit board part 400 (e.g., upper surface of the printed circuit board part 400) and the first surface 300A of the ceramic board part 300 (e.g., lower surface of the ceramic board part 300), a press device (not illustrated) may be located.

The press device (not illustrated) may be a hot press device, and may play a role of applying heat and pressure onto the second surface 400B (upper surface) of the printed circuit board part 400 and the first surface 300A (lower surface) of the ceramic board part 300. The heat and pressure generated by the press device (not illustrated) may be transferred to the adhesive part 200. Through the transferred heat and pressure, the adhesive part 200, the ceramic board part 300, and the printed circuit board part 400 can be pressed with no gap among them.

The adhesive part 200 may be hardened by the received heat and pressure, and may completely adhere the ceramic board part 300 and the printed circuit board part 400 to each other.

The conductive paste 220 may receive the transferred heat and pressure, and may perform sintering. That is, due to the heat and pressure generated by the press device (not illustrated), the conductive paste 220 may be changed from a powder state to an alloy state, and through this, the conductive paste 220 can have a mechanical strength necessary for configuration of the multi-layer printed circuit board 20.

After completion of the thermo-compression through the press device (not illustrated), the support member (not illustrated) being temporarily combined with the one side and the other side of the adhesive part 200, the ceramic board part 300, and the printed circuit board part 400 may be removed.

Although preferred embodiments of the disclosure have been disclosed, the disclosure is not necessarily limited thereto, but any modifications and alterations are possible within the range of the technical idea of the disclosure.

What is claimed is:

1. A method for manufacturing a multi-layer printed circuit board made of different materials, the method comprising:
   providing a board part comprising:
   only a single board comprising a ceramic material;
   an upper conductive layer located on a first surface of the board;
   a lower conductive layer located on a second surface of the board; and
   a ceramic through-hole electrically connecting the upper conductive layer and the lower conductive layer to each other;
   providing a printed circuit board part comprising:

a plurality of core layers stacked in a height direction of the multi-layer printed circuit board, wherein each of the plurality of core layers comprises a material that is different than the ceramic material of the board; and a conductive layer formed on a surface of each of the plurality of core layers;

producing an adhesive part capable of connecting the ceramic board part and the printed circuit board part to each other; and bonding the printed circuit board part, the adhesive part, and the ceramic board part with one another at an identical time, wherein producing the adhesive part comprises:
bonding a protection layer on a first surface of an adhesive layer and a second surface of the adhesive layer;
forming an adhesive part opening penetrating the adhesive layer and the protection layer;
filling the adhesive part opening with a conductive paste; and
removing the protection layer, wherein the ceramic board part is bonded to a first surface of the adhesive part so that the upper conductive layer is in contact with the conductive paste;

wherein the printed circuit board part is bonded to a second surface of the adhesive part so that the conductive layer is in contact with the conductive paste;

wherein the conductive paste is disposed within the adhesive part opening so that the adhesive part opening is not to be aligned with the ceramic through-hole after completing the bonding of the adhesive part and the ceramic board part; and wherein the board of the ceramic board part is formed as a single layer.

2. The method of claim 1, wherein the adhesive layer comprises a prepreg.

3. The method of claim 1, wherein the protection layer comprises polyethylene terephthalate (PET).

4. The method of claim 1, wherein the adhesive layer comprises a second adhesive part opening.

5. The method of claim 1, wherein the adhesive part opening is formed using a mechanical drill.

6. The method of claim 1, further comprising cleaning the adhesive part opening after forming the adhesive part opening.

7. The method of claim 1, wherein the bonding the printed circuit board part, the adhesive part, and the ceramic board part with one another at the identical time comprises:
fixing a first side of the printed circuit board part, a second side of the printed circuit board part, the adhesive part, and the ceramic board part to one another with support members;
bonding the printed circuit board part, the adhesive part, and the ceramic board part to one another by heating and pressing one surface of the printed circuit board part and one surface of the ceramic board part; and
removing the support members.

* * * * *